(12) United States Patent
Miller et al.

(10) Patent No.: US 10,775,004 B2
(45) Date of Patent: Sep. 15, 2020

(54) FULLY ILLUMINATED APPARATUS AND METHOD

(71) Applicant: Roll & Hill, Brooklyn, NY (US)

(72) Inventors: Jason Miller, Brooklyn, NY (US); Eric Beam, Brooklyn, NY (US); Raymond Clepper, Brooklyn, NY (US)

(73) Assignee: Roll & Hill, LLC, Brooklyn, NY (US)

( * ) Notice: Subject to any disclaimer, the term of this patent is extended or adjusted under 35 U.S.C. 154(b) by 0 days.

(21) Appl. No.: 16/195,105

(22) Filed: Nov. 19, 2018

(65) Prior Publication Data
US 2020/0158300 A1   May 21, 2020

(51) Int. Cl.
*F21S 4/00* (2016.01)
*F21S 4/24* (2016.01)
*F21Y 103/30* (2016.01)
*F21Y 103/10* (2016.01)
*F21Y 115/10* (2016.01)
*F21S 4/20* (2016.01)
*F21S 4/28* (2016.01)

(52) U.S. Cl.
CPC . *F21S 4/24* (2016.01); *F21S 4/20* (2016.01); *F21S 4/28* (2016.01); *F21Y 2103/10* (2016.08); *F21Y 2103/30* (2016.08); *F21Y 2115/10* (2016.08)

(58) Field of Classification Search
CPC ........ F21S 4/00; F21S 4/20; F21S 4/22; F21S 4/24; F21S 4/28; F21Y 2103/30; F21Y 2103/10; F21Y 2115/10; F21V 23/005; F21V 23/004; F21K 9/27; F21K 9/20; F21K 9/00
See application file for complete search history.

(56) References Cited

U.S. PATENT DOCUMENTS

| | | | |
|---|---|---|---|
| 2013/0093359 A1* | 4/2013 | Hsu ...................... | F21V 19/003 362/223 |
| 2013/0182432 A1* | 7/2013 | Yoo ........................ | F21V 7/10 362/249.01 |
| 2013/0271971 A1* | 10/2013 | Uemura .................. | F21V 3/02 362/223 |
| 2014/0091335 A1* | 4/2014 | Satake ................... | F21V 17/10 362/249.01 |
| 2018/0163929 A1* | 6/2018 | Jang ....................... | F21S 2/00 |

* cited by examiner

*Primary Examiner* — Y M. Quach Lee
(74) *Attorney, Agent, or Firm* — Timothy W. Menasco, Esq.; Harter Secrest & Emery LLP

(57) ABSTRACT

Embodiments of the present disclosure provide a method and apparatus for illuminating. An exemplary apparatus includes a substrate having a longitudinal axis, and a first plurality of spaced apart fingers extending perpendicular to the longitudinal axis from a first side of the substrate. The apparatus further includes second plurality of spaced apart fingers extending perpendicular to the longitudinal axis of a second side of the substrate, wherein the first side of the substrate is opposite the second side of the substrate. The apparatus still further includes a first plurality of spaced apart lighting elements located on a third side of the substrate, wherein the first plurality of spaced apart lighting elements are spaced along the longitudinal axis of the substrate, and a second plurality of spaced apart lighting elements located on a fourth side of the substrate.

18 Claims, 6 Drawing Sheets

800 — (A) FORMING A SUBSTRATE HAVING A LONGITUDINAL AXIS; (B) FORMING A FIRST PLURALITY OF SPACED APART FINGERS EXTENDING PERPENDICULAR TO THE LONGITUDINAL AXIS FROM A FIRST SIDE OF THE SUBSTRATE; (C) FORMING A SECOND PLURALITY OF SPACED APART FINGERS EXTENDING PERPENDICULAR TO THE LONGITUDINAL AXIS OF A SECOND SIDE OF THE SUBSTRATE, WHEREIN THE FIRST SIDE OF THE SUBSTRATE IS OPPOSITE THE SECOND SIDE OF THE SUBSTRATE; (D) FORMING A FIRST PLURALITY OF SPACED APART LIGHTING ELEMENTS LOCATED ON A THIRD SIDE OF THE SUBSTRATE, WHEREIN THE FIRST PLURALITY OF SPACED APART LIGHTING ELEMENTS ARE SPACED ALONG THE LONGITUDINAL AXIS OF THE SUBSTRATE; AND (E) FORMING A SECOND PLURALITY OF SPACED APART LIGHTING ELEMENTS LOCATED ON A FOURTH SIDE OF THE SUBSTRATE, WHEREIN THE SECOND PLURALITY OF SPACED APART LIGHTING ELEMENTS ARE SPACE ALONG THE LONGITUDINAL AXIS OF THE SUBSTRATE, WHEREIN EACH ONE OF THE SECOND PLURALITY OF SPACED APART LIGHTING ELEMENTS ARE CO-LOCATED WITH ONE OF THE FIRST PLURALITY OF SPACED APART LIGHTING ELEMENTS ALONG THE LONGITUDINAL AXIS OF THE SUBSTRATE, AND WHEREIN THE THIRD SIDE IS OPPOSITE THE FOURTH SIDE

802 — THE METHOD FURTHER COMPRISING FORMING A TUBE HAVING A LONG AXIS, THE TUBE DEFINING A HOLLOW CAVITY EXTENDING THROUGH THE LONG AXIS, WHEREIN THE HOLLOW CAVITY IS OPERABLE TO MAINTAIN THE SUBSTRATE, THE FIRST AND SECOND PLURALITY OF SPACED APART FINGERS, AND THE FIRST AND SECOND PLURALITY OF SPACED APART LIGHTING ELEMENTS

804 — WHEREIN THE TUBE IS MADE OF AT LEAST ONE OF GLASS AND PLASTIC

806 — WHEREIN THE FIRST PLURALITY OF SPACED APART LIGHTING ELEMENTS AND THE SECOND PLURALITY OF SPACED APART LIGHTING ELEMENTS ARE LEDS OPERABLE TO EMIT LIGHT HAVING A FULL WIDTH AT HALF MAXIMUM BETWEEN 160 TO 190

808 — WHEREIN THE SUBSTRATE COMPRISES A LAMINATE PRINTED WIRING BOARD.

810 — WHEREIN THE SUBSTRATE IS FLEXIBLE.

812 — WHEREIN THE FIRST PLURALITY OF SPACED APART FINGERS AND THE SECOND PLURALITY OF SPACED APART FINGERS ARE OPERABLE TO MAINTAIN A LOCATION OF THE FIRST PLURALITY OF SPACED APART LIGHTING ELEMENTS AND THE SECOND PLURALITY OF SPACED APART LIGHTING ELEMENTS AT A RADIAL CENTER OF HOLLOW CAVITY OF THE TUBE

814 — WHEREIN THE TUBE IS OPERABLE TO PROVIDE UNIFORM LIGHT BRIGHTNESS ALONG THE LONG AXIS OF THE TUBE

FIG. 8

FULLY ILLUMINATED APPARATUS AND METHOD

BACKGROUND OF THE INVENTION

Field of the Invention

Embodiments of the present disclosure present a method and apparatus for illuminating. Embodiments of the present disclosure present in particularity a method and apparatus for illuminating a device.

Description of Related Art

A light fixture is an electrical device that maintains a light emitting device that provides light or illumination. All light fixtures typically include a body and one or more light emitting devices. Light fixtures may include a switch to control the light. The switch can be attached to the body or attached to the power cable. Light fixtures that are not removable from a wall or other structure may not include a switch on the fixture itself, but will be operable through a wall switch.

Fixtures need to be connected to an electrical connection or other power source. Some light fixtures are able to run on battery power. Most permanent lighting fixtures are wired directly into power sources. Lighting fixtures that are moveable typically include a plug and/or that plugs into wall sockets.

Some lighting fixtures can include other elements, such as shades to defuse light emitted from the light emitting device, reflectors to redirect emitted light, and an aperture. There is a wide variety of the different types of lighting fixtures created for use in many different industries including the automotive industry, aerospace industry, and fashion design industry.

BRIEF SUMMARY OF THE INVENTION

In view of the foregoing, it is an object of the present disclosure to provide a method and apparatus for illuminating.

A first exemplary embodiment of the present disclosure provides an apparatus for illuminating. The apparatus includes a substrate having a longitudinal axis, and a first plurality of spaced apart fingers extending perpendicular to the longitudinal axis from a first side of the substrate. The apparatus further includes a second plurality of spaced apart fingers extending perpendicular to the longitudinal axis of a second side of the substrate, wherein the first side of the substrate is opposite the second side of the substrate, and a first plurality of spaced apart lighting elements located on a third side of the substrate, wherein the first plurality of spaced apart lighting elements are spaced along the longitudinal axis of the substrate. The apparatus still further includes a second plurality of spaced apart lighting elements located on a fourth side of the substrate, wherein the second plurality of spaced apart lighting elements are space along the longitudinal axis of the substrate, wherein each one of the second plurality of spaced apart lighting elements are co-located with one of the first plurality of spaced apart lighting elements along the longitudinal axis of the substrate, and wherein the third side is opposite the fourth side.

A second exemplary embodiment of the present disclosure provides an apparatus further comprising a tube having a long axis, the tube defining a hollow cavity extending through the long axis, wherein the hollow cavity is operable to maintain the substrate, the first and second plurality of spaced apart fingers, and the first and second plurality of spaced apart lighting elements.

A third exemplary embodiment of the present disclosure provides a method for providing. The method includes forming a substrate having a longitudinal axis, and a first plurality of spaced apart fingers extending perpendicular to the longitudinal axis from a first side of the substrate, and forming a second plurality of spaced apart fingers extending perpendicular to the longitudinal axis of a second side of the substrate, wherein the first side of the substrate is opposite the second side of the substrate. The method further includes forming a first plurality of spaced apart lighting elements located on a third side of the substrate, wherein the first plurality of spaced apart lighting elements are spaced along the longitudinal axis of the substrate, and forming a second plurality of spaced apart lighting elements located on a fourth side of the substrate, wherein the second plurality of spaced apart lighting elements are space along the longitudinal axis of the substrate, wherein each one of the second plurality of spaced apart lighting elements are co-located with one of the first plurality of spaced apart lighting elements along the longitudinal axis of the substrate, and wherein the third side is opposite the fourth side.

A fourth exemplary embodiment of the present disclosure provides a lighting device. The lighting device includes a hollow tube having a longitudinal axis, the hollow tube defining a cavity, and a planar substrate having a first plurality of spaced apart cutouts along a first edge and a second plurality of spaced apart cutouts along a second edge, wherein the first edge is opposite the second edge. The lighting device further includes a first plurality of spaced apart light emitting elements operably affixed on a first face of the planar substrate, and a second plurality of spaced apart light emitting elements operably affixed on a second face of the planar substrate, wherein the first face is opposite the second face, and wherein the first plurality of spaced apart light emitting elements and the second plurality of light emitting elements are operable to emit light in a direction away from the planar substrate at a wide angle. The lighting device still further includes a first plurality of spaced apart moveable fingers fixedly attached to the first face of the planar substrate, and a second plurality of spaced apart moveable fingers fixedly attached to the second face of the planar substrate.

A fifth exemplary embodiment of the present disclosure provides a method of forming. The method includes forming a hollow tube having a longitudinal axis, the hollow tube defining a cavity, and forming a planar substrate having a first plurality of spaced apart cutouts along a first edge and a second plurality of spaced apart cutouts along a second edge, wherein the first edge is opposite the second edge. The method further includes forming a first plurality of spaced apart light emitting elements operably affixed on a first face of the planar substrate, and forming a second plurality of spaced apart light emitting elements operably affixed on a second face of the planar substrate, wherein the first face is opposite the second face, and wherein the first plurality of spaced apart light emitting elements and the second plurality of light emitting elements are operable to emit light in a direction away from the planar substrate at a wide angle. The method still further includes forming a first plurality of spaced apart moveable fingers fixedly attached to the first face of the planar substrate, and forming a second plurality of spaced apart moveable fingers fixedly attached to the second face of the planar substrate.

The following will describe embodiments of the present disclosure, but it should be appreciated that the present disclosure is not limited to the described embodiments and various modifications of the invention are possible without departing from the basic principles. The scope of the present disclosure is therefore to be determined solely by the appended claims.

BRIEF DESCRIPTION OF THE SEVERAL VIEWS OF THE DRAWING(S)

FIG. 8 is an exemplary logic flow diagram in accordance with a method and apparatus for performing exemplary embodiments of this disclosure.

DETAILED DESCRIPTION OF THE INVENTION

Embodiments of the present disclosure provide a method and apparatus operable to provide uniformly emitted light or illumination in 360 degrees around the apparatus. Embodiments of the present disclosure provide an apparatus having a hollow tube shaped lighting device operable to uniformly emit light from the radial surface of the lighting device. In other words, embodiments provide an apparatus wherein the brightness of light along the surface of the hollow tube is uniform. Embodiments provide a lighting device having spaced apart light emitting elements maintained on a substrate operable to be maintained substantially radially centered within a hollow translucent or opaque tube. Embodiments provide a substrate having spaced apart fingers extending perpendicular to the long axis of the substrate operable to maintain a location of the substrate within a hollow tube.

Figure 1:
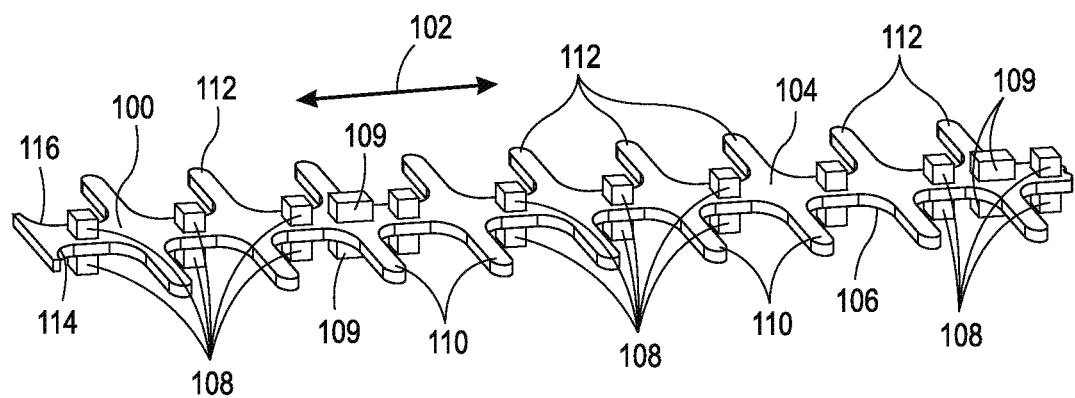
FIG. 1 is a top perspective view of an exemplary substrate of a lighting device suitable for performing exemplary embodiments of the present disclosure.

Referring to FIG. 1, shown is an exemplary substrate operable for performing exemplary embodiments of the present disclosure. Shown in FIG. 1 is flexible substrate 100 having a longitudinal axis (illustrated as line 102). Substrate 100 is operable to flex or bend while continuing to operate properly without breaking or cracking. Substrate 100 is planar shaped such that it includes a first planar face 104 and a second planar face 106 opposite or 180 degrees from the first planar face 104. Substrate 100 is made of a glass-epoxy laminate printed wiring board. Embodiments also include substrate 100 being made of printed circuit board that is glass fiber reinforced (i.e., fiberglass) epoxy resin. Typically the printed circuit board will include a copper foil bonded on to one or both sides of the printed circuit board. Substrate 100 can also be made of paper reinforced phenolic resin with a bonded copper foil. Embodiments of substrate 100 are operable to conduct electricity and/or provide power from a power source connected to substrate 100 to devices or elements (e.g., light emitting elements and resistors) that are operably coupled to substrate 100. Embodiments include substrate 100 being opaque.

Also, shown in FIG. 1 are light emitting elements 108 each operable to emit light generally in a direction away from the surface of substrate 100 to which they are affixed. In this regard, light emitting elements 108 coupled to face 104 of substrate 100 are operable to emit light generally in a direction away from face 104. Likewise, light emitting elements 108 coupled to face 106 of substrate 100 are operable to emit light generally in a direction away from face 106. Embodiments of light emitting elements 108 are operable to emit light with a beam angle between 140 degrees to 180 degrees. In other words, embodiments of light emitting elements 108 are operable to emit light between 0-70 degrees to 0-90 degrees relative to the perpendicular of face 104 or face 106. Each adjacent light emitting element 108 located on face 104 is spaced the same distance from the next adjacent light emitting element 108 on face 104 in order to facilitate even illumination by device 99. Likewise, each adjacent light emitting element 108 located on face 106 is spaced the distance same from the next adjacent light emitting element 108 on face 106 in order to facilitate even illumination by device 99. It should be appreciated that embodiments include each light emitting element 108 not being evening spaced from one another provided that the overall light emitted from the combination of each light emitting element 108 creates uniform illumination.

As shown in FIG. 1, each light emitting element 108 located on face 104 has a corresponding light emitting element 108 co-located on face 106. In other words, each light emitting element 108 located on face 104 has a light emitting element 108 located on face 106 at the same location along the longitudinal axis of substrate 100. It should be appreciated that face 104 and face 106 face opposite directions from one another. Light emitting elements 108 are operably coupled to faces 104, 106 respectively, such that they can receive power and/or electricity from substrate 100 to emit light.

Substrate 100 includes a plurality of spaced apart fingers 110 and a plurality of spaced apart fingers 112. Spaced apart fingers 110 extend perpendicular to the longitudinal axis 102 on a side 114 of substrate 100. Spaced apart fingers 112 extend perpendicular to the longitudinal axis 102 on a side 116. Embodiments of spaced apart fingers 110, 112 have a thickness ranging between 16 mm to 25 mm. As shown in FIG. 1, side 114 is located opposite side 116 such that side 114 faces approximately 180 degrees from side 116. Embodiments include each spaced apart finger 110 having the same length. Embodiments include each spaced apart finger 112 having the same length. It should be appreciated that embodiments include each spaced apart finger 110 having a length equal to that of each spaced apart finger 112. It should also be appreciated that embodiments include the spaced apart fingers 110 having a length different from the spaced apart fingers 112. Embodiments include each adjacent spaced apart finger 110 being equally or unequally spaced from one another. Likewise, embodiments include each adjacent spaced apart finger 112 being equally or unequally spaced from one another. Embodiments of spaced apart fingers 110, 112 are operable to maintain a relative location of substrate 100 with respect to an interior radial surface of hollow tube 117 (shown in FIG. 2) in which substrate 100 is placed. Embodiments provide that spaced apart fingers 110, 112 are operable to maintain the location of substrate 100 generally at the radial center of a hollow tube 117 in which substrate 100 is placed. However, it should be appreciated that embodiments include spaced apart fingers 110, 112 being operable to maintain the location of substrate 100 generally off of the radial center of hollow tube 117 in which the substrate 100 is placed provided that device 99 with substrate 100 and lighting elements 108 provide uniform illumination and brightness throughout the radial surface of the tube. Spaced apart fingers 110, 112 are operable to dissipate heat created by light emitting elements 108 such that the light emitting elements 108 do not over heat. In one embodiment, spaced apart fingers 110, 112 are operable to dissipate at least 0.3 watts per linear inch. The distal end of spaced apart fingers 110, 112 that are in contact with the interior radial surface 118 of hollow tube 117 have a size small enough such that they do not obstruct the passage of light from light emitting elements 108. In other words, the distal end of spaced apart fingers 110, 112 do not block enough light from light emitting elements 108 such that spaced apart fingers 110, 112 create dark spots or regions on the surface of hollow tube 117. Embodiments of spaced apart fingers 110, 112 have a width of between 0.03 to 0.05 inches and a thickness between 0.02 to 0.04 inches. Embodiments of spaced apart fingers 110, 112 have a cross-sectional shape relative to their length that is rectangular or circular shaped. Embodiments of spaced apart fingers 110, 112 are circular shaped having a diameter between 0.03 to 0.07 inches.

Substrate 100 and spaced apart fingers 110, 112 are operable to conduct electricity to provide power to light emitting elements 108 and resistors 109.

Also shown in FIG. 1 are resistors 109 operably coupled to face 104 and face 106 of substrate 100. Resistors 109 are located between light emitting elements 108 and are operable to maintain the uniformity of light emitted by the light emitting elements 108.

Figure 2:
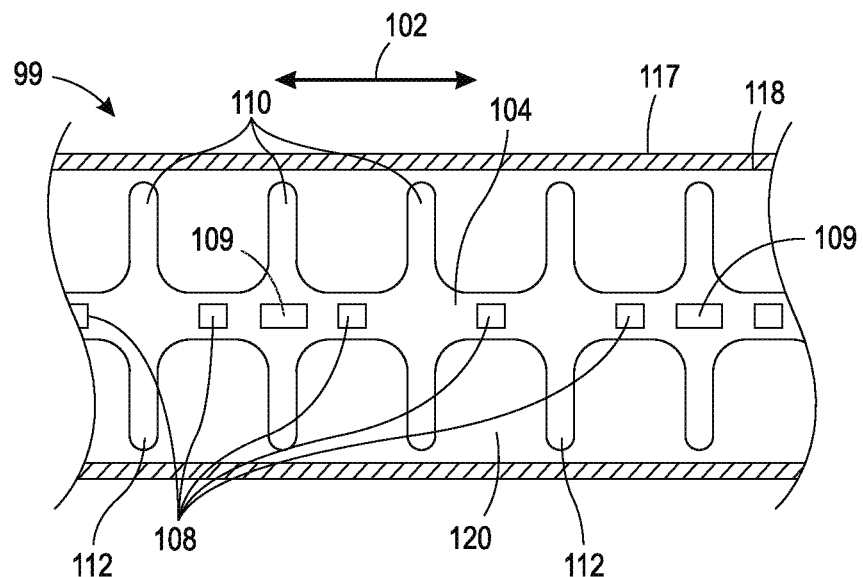
FIG. 2 is a top cross-sectional view of an exemplary lighting device suitable for performing exemplary embodiments of the present disclosure.

Referring to FIG. 2, shown is a top cross-sectional perspective view of an exemplary device 99 suitable for performing exemplary embodiments of the present disclosure. Shown in FIG. 2 is device 99 which includes hollow tube 117 having an interior radial surface 118 that defines a cavity 120. Embodiments of hollow tube 117 are made of glass or plastic. Embodiments of hollow tube 116 are clear, opaque, frosted, translucent, or another other color (e.g., red, blue, green, yellow, etc.). In one embodiment, hollow tube 117 has a diameter below 1.5 inches. However, it should be appreciated that hollow tube 117 can have a diameter ranging between 7 mm to 50 mm. Embodiments provide that hollow tube 117 has a wall thickness ranging between 2 mm to 4 mm. In one embodiment, hollow tube 117 has a wall thickness of approximately 3 mm. In one embodiment, cavity 120 (aside from substrate 100) can contain air or other gaseous substance. In another embodiment, cavity 120 (aside from substrate 100) does not contain any air or gaseous substance, but is a vacuum. In this embodiment, hollow tube 117 is sealed from the surrounding environment such that air or other fluids cannot enter cavity 120.

Hollow tube 117 has a longitudinal axis 102. Maintained within hollow tube 117 is substrate 100. Substrate 100 includes spaced apart fingers 110, 112 which extend perpendicular to the longitudinal axis 102 of substrate 100. As illustrated in FIG. 2, spaced apart fingers 110, 112 are in contact with interior radial surface 118 of hollow tube 117. In this regard, spaced apart fingers 110, 112 maintain the location of substrate 100 relative to interior radial surface 118. Also, shown are lighting emitting elements 108 operably affixed to face 104 of substrate 100, and resistors 109 operably affixed to face 104 of substrate 100. It should be appreciated that substrate 100 shown in FIG. 2 also includes corresponding light emitting elements 108 and resistors 109 operably coupled to face 106 of substrate 100.

Figure 3:
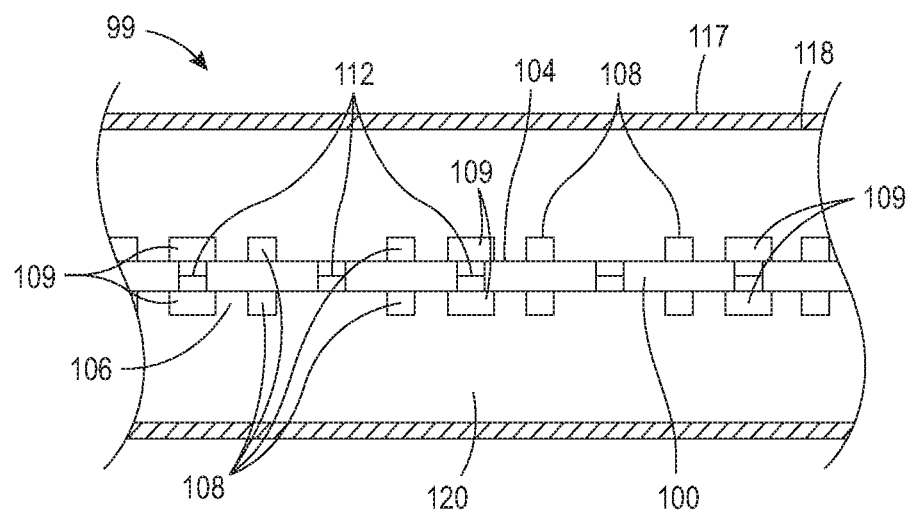
FIG. 3 is a side cross-sectional view of an exemplary lighting device suitable for performing exemplary embodiments of the present disclosure.

Referring to FIG. 3, shown is a side cross-sectional view of a device 99 suitable for performing exemplary embodiments of the present disclosure. As illustrated in FIG. 3, device 99 includes hollow tube 117 and substrate 100. Substrate 100 includes light emitting elements 108 located on face 104. Substrate 100 also includes light emitting elements 108 located on face 106. As depicted, face 104 is opposite (i.e., 180 degrees) from face 106. Each light emitting element 108 located on face 104 has a corresponding or co-located light emitting element 108 located on face 106. Likewise, substrate 100 includes resistors 109 located between the light emitting elements 108 on face 104, 106. Each resistor 109 located on face 104 have a corresponding resistor 109 co-located or corresponding resistor 109 located on face 106. The distal end of spaced apart fingers 112 are also shown in FIG. 3. In FIG. 3, the distal end of spaced apart fingers 112 are in contact with the radial interior surface of hollow tube 117.

Figure 4:
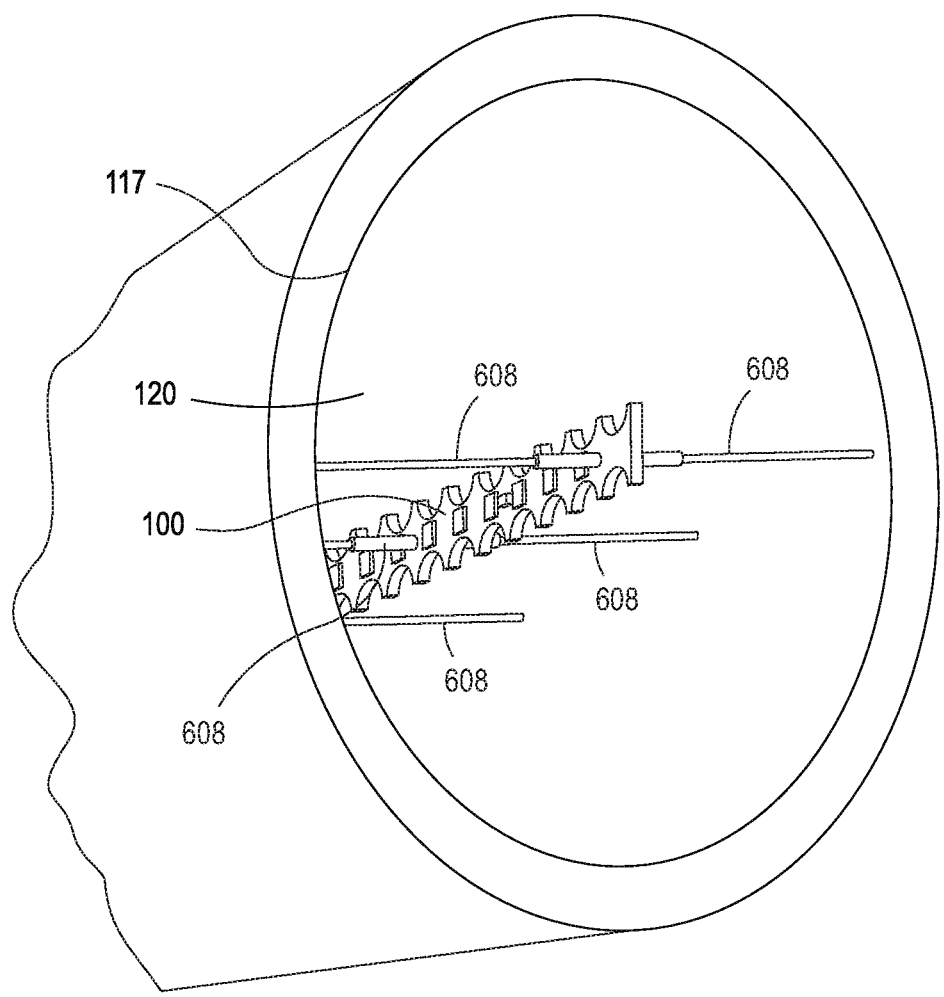
FIG. 4 is an interior view of an exemplary lighting device suitable for performing exemplary embodiments of the present disclosure.

Referring to FIG. 4, depicted is an interior view of an exemplary lighting device suitable for performing exemplary embodiments of the present disclosure. Shown in FIG. 4 is the interior radial surface of hollow tube 117, which defines cavity 120. Maintained within cavity 120 is substrate 100. As shown in FIG. 4, moveable fingers 608 are extend in opposite directions and are in contact with the interior radial surface of hollow tube 117. As illustrated in FIG. 4, moveable fingers 608 operably maintain the location of the substrate 100 relative to the interior radial surface of hollow tube 117.

Figure 5:
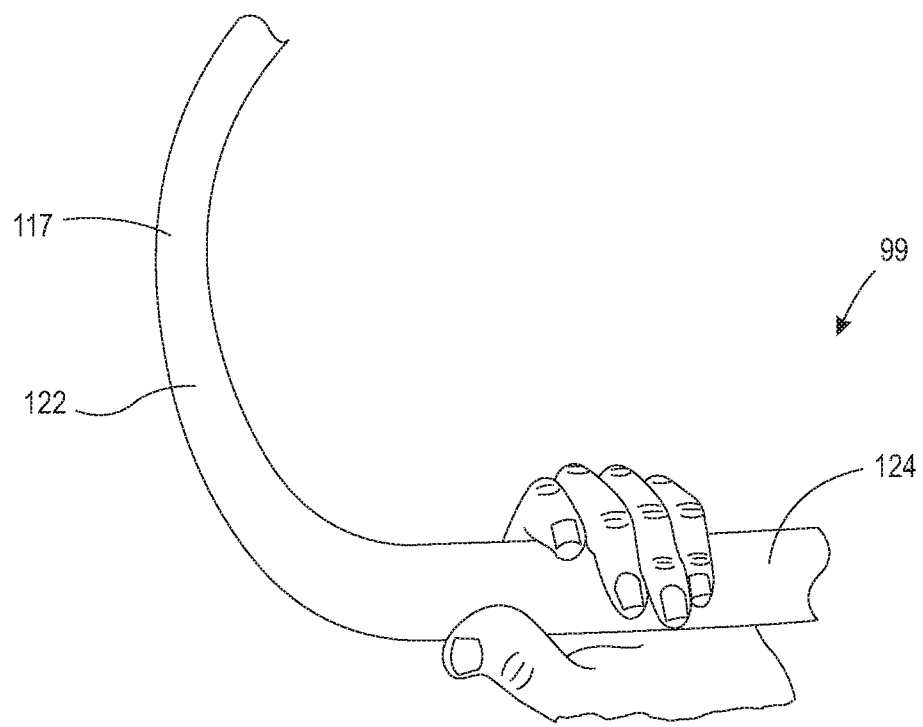
FIG. 5 is an exterior side view of an exemplary lighting device suitable for performing exemplary embodiments of the present disclosure.

Referring to FIG. 5, shown is a perspective view of a lighting device suitable for performing exemplary embodiments of the present disclosure. Shown in FIG. 5 is device 99. In this embodiment, device 99 includes a hollow tube 117 that maintains a substrate 100 with light emitting elements 108 operable to uniformly illuminate hollow tube 117. As shown, hollow tube 117 includes a curved section 122 (non-linear section) and a straight portion 124 (linear section). However, it should be appreciated that embodiments of hollow tube 117 can be any shape including curved, straight, and/or curled sections.

Figure 6:
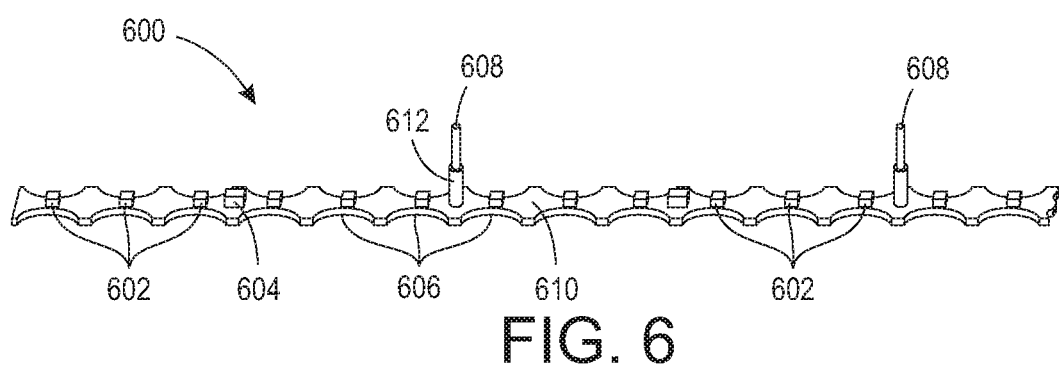
FIG. 6 is a top perspective view of an alternative exemplary substrate of a lighting device suitable for performing exemplary embodiments of the present disclosure.

Referring to FIG. 6, shown is a top perspective view of an alternative substrate suitable for performing exemplary embodiments of this disclosure. Shown in FIG. 6 is substrate 600 having light emitting elements 602, resistors 604, spaced apart cutouts 606, and moveable fingers 608. Spaced apart cutouts 606 are curve shaped (e.g., U-shaped) sections along the edge of substrate 600. However, it should be appreciated that the spaced apart cutouts 606 can be any shape including V-shaped, oval shaped, circular shaped or rectangular shaped. Embodiments of spaced apart cutouts 606 provide the minimum amount of substrate 600 necessary to (i) maintain the structural integrity of substrate 600 such that it is operable to flex or bend and accommodate the light emitting elements 602 and resistors 604, and to (ii) not obstruct the light emitted by light emitting elements 602. In other words, spaced apart cutouts 606 are operable to allow light emitted from light emitting elements 602 to illuminate without obstruction. As depicted in FIG. 6, each spaced apart cutout 606 along edge 608 of substrate 600 has a co-located or corresponding spaced apart cutout 606. Substrate 600 includes moveable fingers 608 extending perpendicular from face 610 of substrate 600. Moveable fingers 608 are operable to extend or collapse in length in response to an opposing surface. In one embodiment, moveable fingers 608 include an internal spring 612 operable to maintain moveable finger 608 in an extended position. Internal spring 612 is operable to allow moveable fingers 608 to expand or contract in response to an opposing surface (e.g., interior radial surface of hollow tube 117). Moveable fingers 608 are operable to maintain the location of substrate 600 within a cavity 120 relative to a hollow tube 117 (shown in FIG. 7). In another embodiment, moveable fingers 608 do not include a spring 612, but are flexible and are operable to flex or bend in order to provide a friction fit with the interior surface of hollow tube 117.

Figure 7:
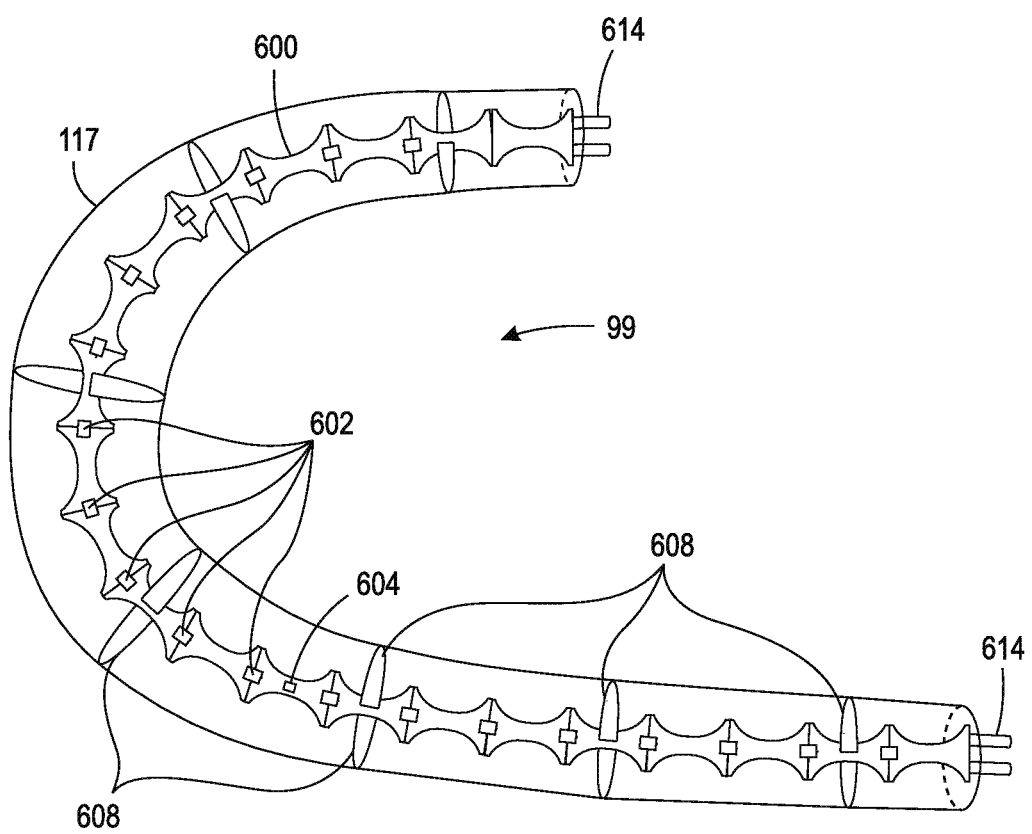
FIG. 7 is a side cross-sectional view of an alternative exemplary lighting device suitable for performing exemplary embodiments of the present disclosure.

Referring to FIG. 7, shown is side view of an exemplary device suitable for performing exemplary embodiments of the present disclosure. Shown in FIG. 7 is device 99 having a hollow tube 117 and substrate 600. Substrate 600 includes light emitting elements 602, resistors 604, spaced apart cutouts 606, and moveable fingers 608. As illustrated, moveable fingers 608 are in contact with the interior radial surface of hollow tube 117. Also, shown in FIG. 7 is power connectors 614 located on the terminal ends of hollow tube 117. Power connectors 614 are operably coupled substrate 600 such that power and/or electrical current can pass from a power source to the power connectors 614 to substrate 600, which then provides power to light emitting elements 602 so that they can emit light.

The distal end of moveable fingers 608 in contact with the interior radial surface of hollow tube 117 have a size small enough such that they do not obstruct the passage of light from light emitting elements 108. In other words, the distal end of moveable fingers 608 do not block enough light from light emitting elements 108 such that moveable fingers 608 create dark spots or dark regions on the surface of hollow tube 117 that have a different brightness than other areas of hollow tube 117. Embodiments of moveable fingers 608 have a diameter of 1.6 mm at the proximal end (i.e., the point of connection with substrate 600) and a diameter of 1.1 mm at the distal end. However, it should be appreciated that embodiments of include the distal end of moveable fingers 608 having a diameter ranging between 1 mm to 1.5 mm.

Reference is now made to FIG. 8, which presents a logic flow diagram in accordance with a method and apparatus for performing exemplary embodiments of this disclosure. The process begins at block 800 which states (a) forming a substrate having a longitudinal axis; (b) forming a first plurality of spaced apart fingers extending perpendicular to the longitudinal axis from a first side of the substrate; (c) forming a second plurality of spaced apart fingers extending perpendicular to the longitudinal axis of a second side of the substrate, wherein the first side of the substrate is opposite the second side of the substrate; (d) forming a first plurality of spaced apart lighting elements located on a third side of the substrate, wherein the first plurality of spaced apart lighting elements are spaced along the longitudinal axis of the substrate; and (e) forming a second plurality of spaced apart lighting elements located on a fourth side of the substrate, wherein the second plurality of spaced apart lighting elements are space along the longitudinal axis of the substrate, wherein each one of the second plurality of spaced apart lighting elements are co-located with one of the first plurality of spaced apart lighting elements along the longitudinal axis of the substrate, and wherein the third side is opposite the fourth side.

Next at block 802, the method further comprising forming a tube having a long axis, the tube defining a hollow cavity extending through the long axis, wherein the hollow cavity is operable to maintain the substrate, the first and second plurality of spaced apart fingers, and the first and second plurality of spaced apart lighting elements.

Some of the non-limiting implementations detailed above are also summarized at FIG. 8 following block 802. Block 804 relates to wherein the tube is made of at least one of glass and plastic. Block 806 further specifies wherein the first plurality of spaced apart lighting elements and the second plurality of spaced apart lighting elements are LEDs operable to emit light having a full width at half maximum between 160° to 190°. Then block 808 relates to wherein the substrate comprises a laminate printed wiring board. Block 810 states wherein the substrate is flexible. Next, block 812 indicates wherein the first plurality of spaced apart fingers and the second plurality of spaced apart fingers are operable to maintain a location of the first plurality of spaced apart lighting elements and the second plurality of spaced apart lighting elements at a radial center of hollow cavity of the tube. Finally, block 814 specifies wherein the tube is operable to provide uniform light brightness along the long axis of the tube.

Thus, exemplary embodiments of the present disclosure provide a method for forming a lighting device that can provide uniform brightness and/or illumination along a radial surface of a tubular shaped device. The logic diagram of FIG. 8 may be considered to illustrate the operation of a method, and/or the specific manner in which components of a device are configured to operate or be manufactured, whether such a device is a lighting device, a lighting fixture, a lighting element, a lamp, a chandelier, and/or a pendant.

The invention has been described in detail with particular reference to a presently preferred embodiment, but it will be understood that variations and modifications can be effected within the spirit and scope of the invention. The presently disclosed embodiments are therefore considered in all aspects to be illustrative and not restrictive. The scope of the invention is indicated by the appended claims, and all changes that come within the meaning and range of equivalents thereof are intended to be embraced therein.

The invention claimed is:

1. A lighting device comprising:
   a hollow tube having a longitudinal axis, the hollow tube defining a cavity;
   a planar substrate having a first plurality of spaced apart cutouts along a first edge and a second plurality of spaced apart cutouts along a second edge, wherein the first edge is opposite the second edge;
   a first plurality of spaced apart light emitting elements operably affixed on a first face of the planar substrate;
   a second plurality of spaced apart light emitting elements operably affixed on a second face of the planar substrate, wherein the first face is opposite the second face, and wherein the first plurality of spaced apart light emitting devices and the second plurality of light emitting elements are operable to emit light in a direction away from the planar substrate at a wide angle;
   a first plurality of spaced apart moveable fingers fixedly attached to the first face of the planar substrate; and
   a second plurality of spaced apart moveable fingers fixedly attached to the second face of the planar substrate.

2. The lighting device according to claim 1, wherein the first plurality of spaced apart moveable fingers and the second plurality of spaced apart moveable fingers are operable to maintain a location of the planar substrate within the cavity relative to the hollow tube.

3. The lighting device according to claim 1, the lighting device further comprising a plurality of spaced apart resistors operably affixed to the planar substrate.

4. The lighting device according to claim 1, wherein the planar substrate is operable to dissipate heat created by the first and second plurality of spaced apart light emitting elements.

5. The lighting device according to claim 1, wherein the hollow tube comprises at least one of a linear portion and a non-linear portion.

6. The lighting device according to claim 1, wherein the hollow tube is made of at least one of glass and plastic.

7. The lighting device according to claim 1, wherein the first plurality of spaced apart light emitting devices and the second plurality of spaced apart light emitting devices are LEDs operable to emit light with a beam angle between 160° to 180°.

8. The lighting device according to claim 1, wherein the planar substrate comprises a glass-epoxy laminate printed wiring board.

9. The lighting device according to claim 1, wherein the planar substrate is flexible.

10. A method of forming, the method comprising:
(a) forming a hollow tube having a longitudinal axis, the hollow tube defining a cavity;
(b) forming a planar substrate having a first plurality of spaced apart cutouts along a first edge and a second plurality of spaced apart cutouts along a second edge, wherein the first edge is opposite the second edge;
(c) forming a first plurality of spaced apart light emitting elements operably affixed on a first face of the planar substrate;
(d) forming a second plurality of spaced apart light emitting elements operably affixed on a second face of the planar substrate, wherein the first face is opposite the second face, and wherein the first plurality of spaced apart light emitting devices and the second plurality of light emitting elements are operable to emit light in a direction away from the planar substrate at a wide angle;
(e) forming a first plurality of spaced apart moveable fingers fixedly attached to the first face of the planar substrate; and
(f) forming a second plurality of spaced apart moveable fingers fixedly attached to the second face of the planar substrate.

11. The method according to claim 10, wherein the first plurality of spaced apart moveable fingers and the second plurality of spaced apart moveable fingers are operable to maintain a location of the planar substrate within the cavity relative to the hollow tube.

12. The method according to claim 11, the method further comprising forming a plurality of spaced apart resistors operably affixed to the planar substrate.

13. The method according to claim 11, wherein the planar substrate is operable to dissipate heat created by the first and second plurality of spaced apart light emitting elements.

14. The method according to claim 11, wherein the hollow tube comprises at least one of a linear portion and a non-linear portion.

15. The method according to claim 11, wherein the hollow tube is made of at least one of glass and plastic.

16. The method according to claim 11, wherein the first plurality of spaced apart light emitting devices and the second plurality of spaced apart light emitting devices are LEDs operable to emit light with a beam angle between 160° to 180°.

17. The method according to claim 11, wherein the planar substrate comprises a glass-epoxy laminate printed wiring board.

18. The method according to claim 11, wherein the planar substrate is flexible.

* * * * *